(12) United States Patent
Lee et al.

(10) Patent No.: US 11,828,548 B2
(45) Date of Patent: Nov. 28, 2023

(54) TWO-PHASE IMMERSION-COOLING MICRO-GROOVED BOILER

(71) Applicants: Fang-Shou Lee, Taoyuan (TW); Cho-Han Lee, Taoyuan (TW)

(72) Inventors: Fang-Shou Lee, Taoyuan (TW); Cho-Han Lee, Taoyuan (TW); Fang Wang, Livermore, CA (US)

( * ) Notice: Subject to any disclaimer, the term of this patent is extended or adjusted under 35 U.S.C. 154(b) by 17 days.

(21) Appl. No.: 17/467,446

(22) Filed: Sep. 6, 2021

(65) Prior Publication Data

US 2022/0221231 A1 Jul. 14, 2022

(30) Foreign Application Priority Data

Jan. 8, 2021 (TW) ................. 110200244

(51) Int. Cl.
*F28F 3/04* (2006.01)
*F28D 15/04* (2006.01)

(52) U.S. Cl.
CPC ............ *F28F 3/048* (2013.01); *F28D 15/046* (2013.01); *F28F 2260/02* (2013.01)

(58) Field of Classification Search
CPC ..... F28F 3/048; F28F 2260/02; F28D 15/046; H05K 7/203; H05K 7/20936
USPC ................................................... 165/104.26
See application file for complete search history.

(56) References Cited

U.S. PATENT DOCUMENTS

| | | | |
|---|---|---|---|
| 4,050,507 A | * | 9/1977 | Chu ...................... H01L 23/427 165/96 |
| 4,274,479 A | * | 6/1981 | Eastman ................ F28D 15/046 29/890.032 |
| 4,322,737 A | * | 3/1982 | Sliwa, Jr. ................ H01L 23/34 257/684 |
| 4,819,719 A | * | 4/1989 | Grote .................... F28D 15/046 122/366 |
| 6,381,846 B2 | | 5/2002 | Insley et al. |
| 6,904,966 B2 | | 6/2005 | Philpott et al. |
| 7,571,618 B2 | | 8/2009 | Dessiatoun |
| 8,252,245 B2 | | 8/2012 | Tonkovich et al. |
| 8,596,341 B2 | | 12/2013 | Tegrotenhuis et al. |
| 9,103,468 B2 | | 8/2015 | Li et al. |
| 9,103,607 B2 | | 8/2015 | Furberg et al. |
| 10,386,133 B2 | | 8/2019 | Li et al. |

(Continued)

FOREIGN PATENT DOCUMENTS

| | | |
|---|---|---|
| CN | 203731914 U | 7/2014 |
| CN | 105865089 A | 8/2016 |

*Primary Examiner* — Tho V Duong (57) ABSTRACT

The present invention discloses a two-phase immersion-cooling micro-grooved boiler, which is mainly used for heat dissipation of heat generating objects. The boiler comprises a heat transfer member and a capillary layer positioned in tight contact with a surface of the heat transfer member. The capillary layer has an array of micro-grooves which divides the capillary layer into a plurality of heat dissipating units. The bottom surface of the micro-grooves is coated with a thermal resistance layer. While the boiler operates, the working liquid can flow into the heat dissipating units from the sidewall of the micro-grooves without being blocked from contact with the heat transfer member by boiling-triggered bubbles. As a result, dry-out of the heat transfer member can be avoided, thereby improving the heat exchange efficiency of the boiler and the flow-back rate of the working fluid.

5 Claims, 5 Drawing Sheets

(56) References Cited

U.S. PATENT DOCUMENTS

| | | | |
|---|---|---|---|
| 2005/0205243 A1* | 9/2005 | Rosenfeld | F28D 15/046 165/104.26 |
| 2007/0012431 A1* | 1/2007 | Miyahara | F28D 15/0233 165/181 |
| 2021/0293488 A1* | 9/2021 | Lewis | F28D 15/0233 |

* cited by examiner

TWO-PHASE IMMERSION-COOLING MICRO-GROOVED BOILER

CROSS-REFERENCE TO RELATED APPLICATION

This application claims priority to an earlier Taiwan patent application Ser. No. 110200244, filed Jan. 8, 2021, which is incorporated herein by reference in its entirety.

BACKGROUND OF THE INVENTION

Field of Invention

The present invention relates to a boiler. More specifically, this present invention relates to a two-phase immersion-cooling micro-grooved boiler.

Description of the Related Art

In recent years, electronic technology has developed rapidly, especially high-power electronic equipments. With the increase in the power of electronic equipments, bigger heat dissipation capacity is required. Therefore, the cooling of electronic equipments is one of the major issues to be addressed.

Regarding the cooling method of electronic equipments, the immersion-cooling boiler or heat exchanger has been widely used in the fields of electronics, chemical engineering and the like. The immersion-cooling boiler employs a two-phase fluid boiling heat exchange method to achieve the effect of heat dissipation. Practically applied, the boiler is in thermal contact with heat generating objects and submerged within a non-conductive insulating working liquid. When heat generating objects are in operation, a great deal of heat is generated, and then transferred to the boiler through a copper heat transfer plate. As a result, the working fluid is boiled due to absorbing the heat of the boiler. The boiling-triggered bubbles flow out from the outer surface of the boiler; in the meantime the working fluid must continue to flow into the outer surface of the boiler, ensuring the consistent efficient heat dissipation.

However, in the event that the outflow pressure of the bubbles is equal to or greater than the inflow pressure of the working liquid, the copper heat transfer cannot have access to the working liquid due to the entire outer surface of the boiler being covered by the boiling-triggered bubbles, resulting in the failure of heat transfer. Such failure of heat transfer, generally called dry-out, causes the boiler to malfunction.

In view of this, in order to ensure high heat exchange efficiency and sufficient working fluid flowback during the immersion-cooling boiler operates, it is necessary to develop a novel immersion-cooling boiler that can solve the aforementioned problem.

BRIEF SUMMARY OF THE INVENTION

The object of the present invention is to provide a two-phase immersion-cooling micro-grooved boiler, which is mainly applied to solve the heat transfer inefficiency of the immersion-cooling boiler.

In order to attain the aforesaid object, according to one embodiment, provided is a two-phase immersion-cooling micro-grooved boiler, which comprises a heat transfer plate for thermal contact with a heat generating object to be cooled, and a capillary layer positioned in tight contact with a surface of the heat transfer plate. The capillary layer has an array of micro-grooves, which divides the capillary layer into a plurality of heat dissipating units. A bottom surface of the micro-grooves is coated with a thermal resistance layer.

In one or more embodiments, the micro-grooves are arranged in a spaced, parallel relationship on the heat transfer plate.

In one or more embodiments, the micro-grooves are arranged on the heat transfer plate in a symmetrical, inclined direction toward a longitudinal center line of the heat transfer plate.

In one or more embodiments, the micro-grooves have a cross-sectional width of between 300 μm and 800 μm.

In one or more embodiments, the heat dissipating units have a plurality of capillary pores which has a cross-sectional diameter of between 5 μm and 50 μm.

As aforementioned, according to the two-phase immersion-cooling micro-grooved boiler disclosed in the present invention, while the boiler absorbs the heat generated by the heat generating object, the working liquid can flow into the capillary pores of the heat dissipating units from the sidewall of the micro-grooves without being blocked from contact with the heat transfer plate by boiling-triggered bubbles. As a result, dry-out of the boiler can be avoided, thereby improving the heat exchange efficiency of the boiler and the flow-back rate of the working fluid.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION OF THE INVENTION

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments. In the illustration of the various embodiments, two different figures can be provided that have overlaps and/or similarities in the components within the two figures (e.g., FIGS. 3 and 4). In such instances, the descriptions of these figures can be presented together with associated similar reference numerals separated by commas and/or a slash. Some components that are not expected to be different from one implementation to the other are provided the same reference numerals within the figures, to simplify the descriptions of the figures.

Those of ordinary skill in the art will appreciate that the hardware components and basic configuration depicted in any of the figures illustrated by the drawings and described herein may vary. For example, the illustrative components within a boiler (FIG. 3) and other devices and systems are not intended to be exhaustive, but rather be representative of and highlight components that can be utilized to implement aspects of the present disclosure. For example, other devices/components may be used in addition to or in place of the hardware depicted. The depicted examples do not convey or imply any architectural or other limitations with respect to the presently described embodiments and/or the general disclosure.

The object of the present invention is to provide a two-phase immersion-cooling micro-grooved boiler, which is mainly applied to solve the heat transfer inefficiency of the immersion-cooling boiler.

Figure 1:
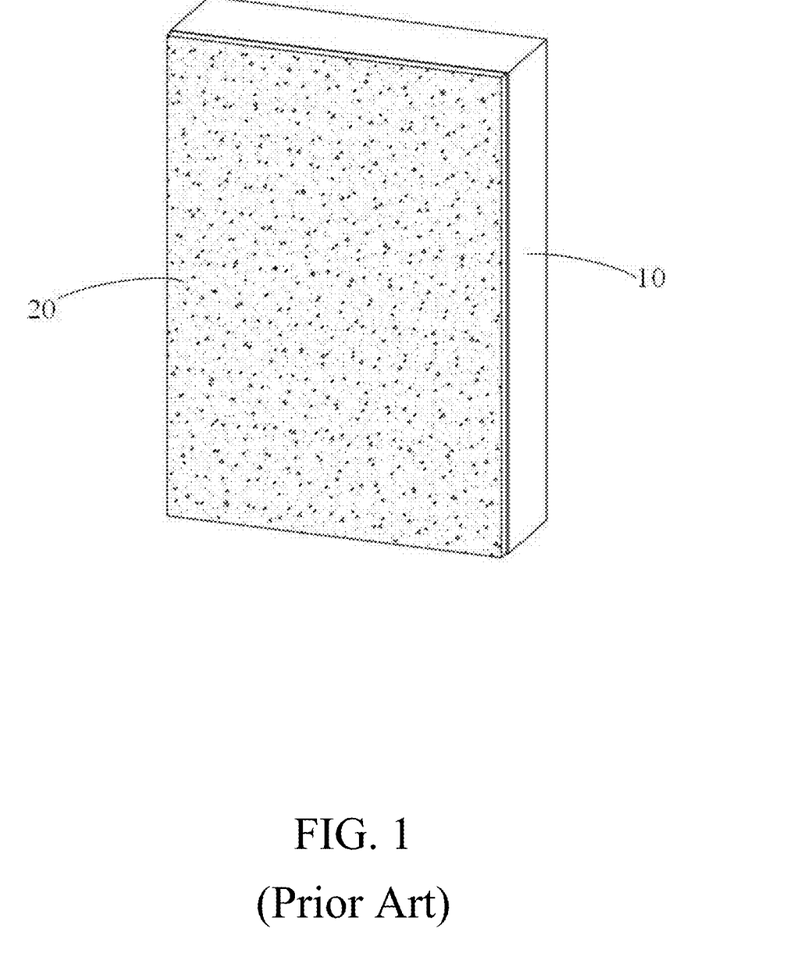
FIG. 1 is a perspective view of an example conventional immersion-cooling boiler, according to prior art.

Turning now to the figures, FIG. 1 illustrates a perspective view of an example conventional immersion-cooling boiler. According to prior art, the conventional immersion-cooling boiler structurally includes a heat transfer plate 10 for thermal contact with a heat generating object to be cooled, and a capillary layer 20. The capillary layer 20 is positioned in tight contact with a surface of the heat transfer plate 10. It should be noted that the capillary layer 20 does not have any micro-grooves.

Figure 2:
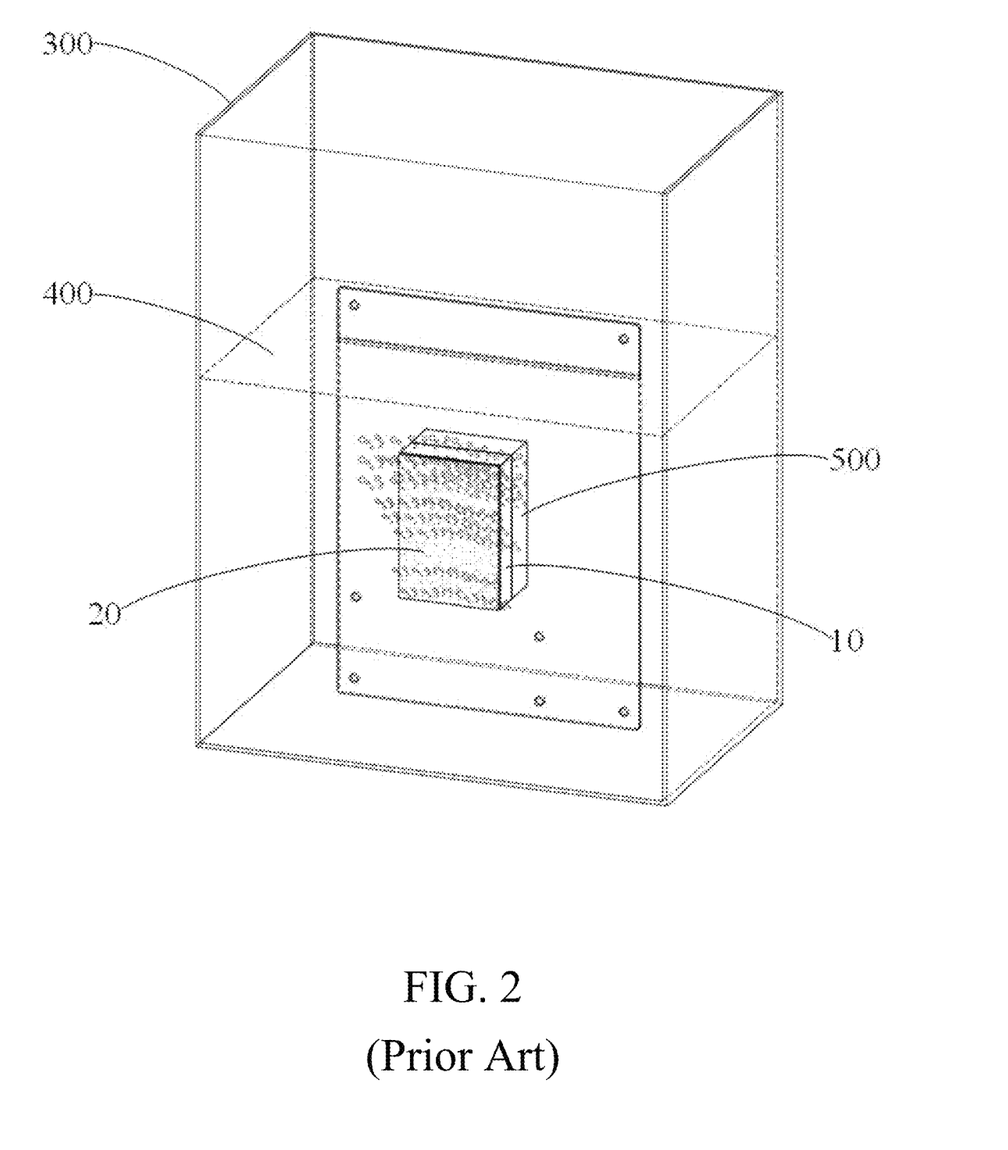
FIG. 2 is a schematic perspective view illustrating how an example conventional immersion-cooling boiler is applied to cool a heat generating object, according to prior art.

Next, with reference to FIG. 2, there is presented a schematic perspective view illustrating how an example conventional immersion-cooling boiler is applied to cool a heat generating object, according to prior art. As shown in FIG. 2, practically applied, the conventional immersion-cooling boiler is in thermal contact with a heat generating object 500 to be cooled. Specifically, it's the heat transfer plate 10 of the immersion-cooling boiler that is in thermal contact with the heat generating object 500, which is submerged within a non-conductive insulating working fluid 400 in a cabinet 300. When the heat generating object 500 operates, a great amount of heat is generated, and then transferred to the boiler by way of the heat transfer plate 10. Subsequently, the working fluid 400 is boiled due to absorbing the heat of the boiler. The boiling-triggered bubbles flow out from the surface of the capillary layer 20, and then the working fluid 400 continuously flows into the capillary layer 20 to achieve the effect of consistent heat transfer.

However, given the conventional immersion-cooling boiler, the capillary layer 20 does not have any micro-grooves. In the event that the outflow pressure of the bubbles is equal to or greater than the inflow pressure of the working liquid, the working liquid 400 is blocked from flowing into the capillary layer 20 due to the entire outer surface of the capillary layer 20 being covered by the boiling-triggered bubbles. Therefore, the heat transfer plate 10 cannot have access to the working liquid 400, resulting in the failure of heat transfer. Such failure of heat transfer, so called dry-out, causes the boiler to malfunction.

Figure 3:
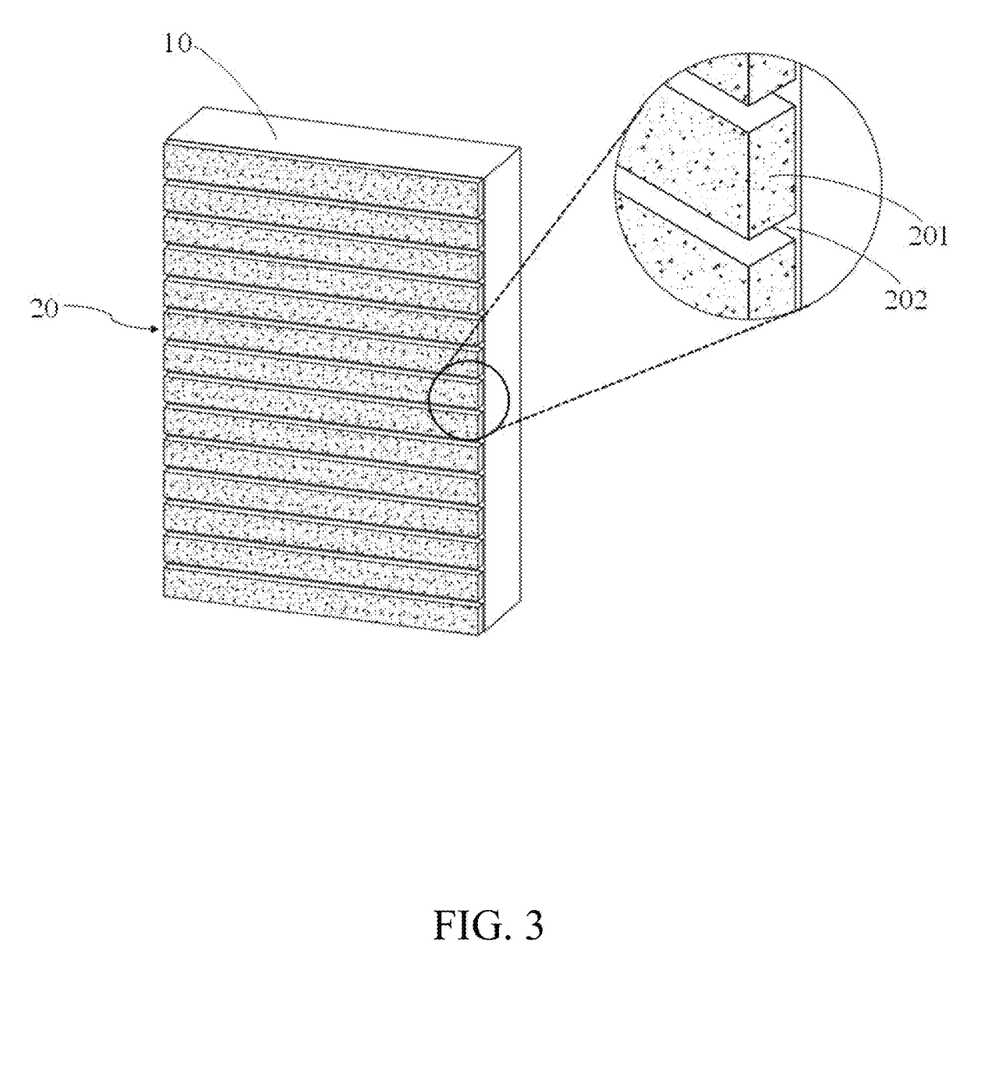
FIG. 3 is a perspective view of an example two-phase immersion-cooling micro-grooved boiler, according to one or more embodiments.
Figure 4:
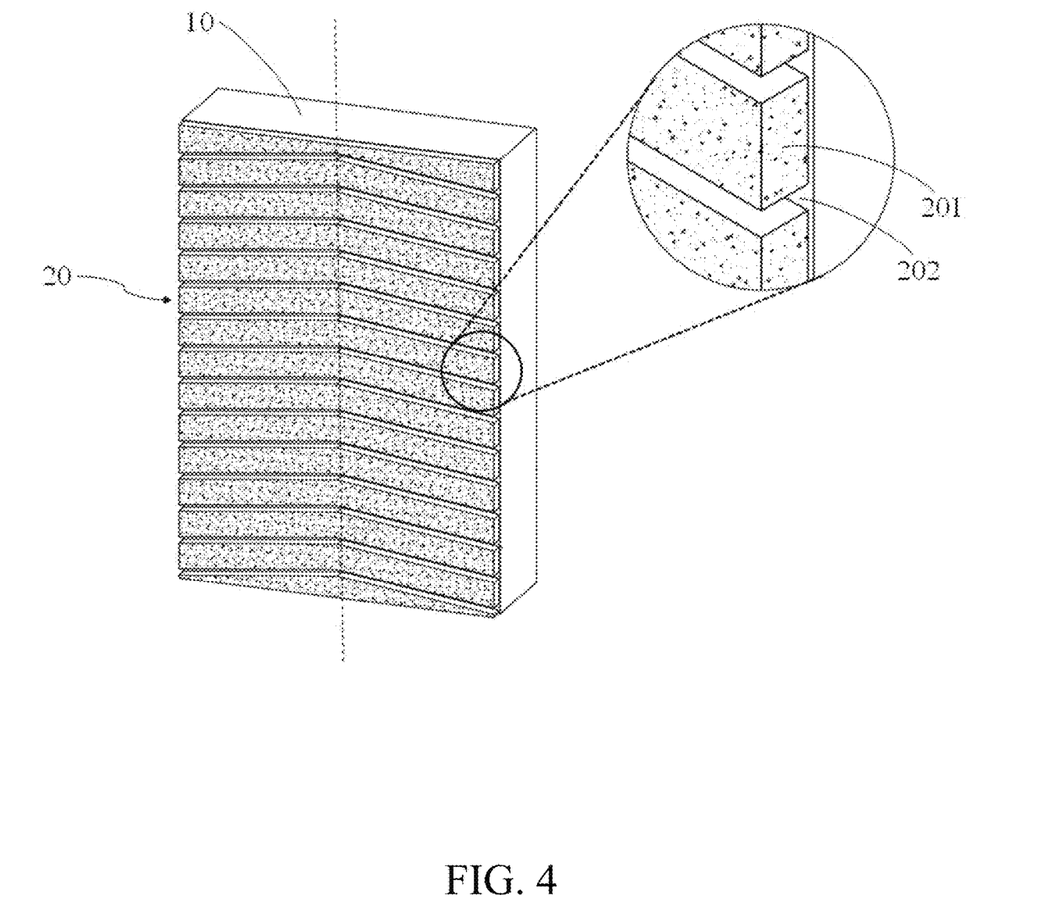
FIG. 4 is a perspective view of an another example two-phase immersion-cooling micro-grooved boiler, according to one or more embodiments.

In view of this, in order to solve the above-mentioned defect in the conventional immersion-cooling boiler, a two-phase immersion-cooling micro-grooved boiler is provided. With reference now to FIG. 3, there is presented a perspective view of an example two-phase immersion-cooling micro-grooved boiler. According to one embodiment of the present invention, the present immersion-cooling boiler includes a heat transfer plate 10 for thermal contact with a heat generating object to be cooled, and a capillary layer 20. The capillary layer 20 is positioned in tight contact with a surface of the heat transfer plate 10. It is worth noting that the capillary layer 20 has an array of micro-grooves 202, which divides the capillary layer 20 into a plurality of heat dissipating units 201. The micro-grooves 202 are arranged in a spaced, parallel relationship on the heat transfer plate 10. According to a preferred embodiment, as shown in FIG. 4, the micro-grooves 202 are arranged on the heat transfer plate 10 in a symmetrical, inclined direction toward a longitudinal center line of the heat transfer plate 10.

According to a preferred embodiment, the micro-grooves 202 have a cross-sectional width of between 300 μm and 800 μm. In addition, the total cross-sectional area of all the micro-grooves 202 represents no more than 5% of the total surface area of the heat transfer plate 10.

Figure 5:
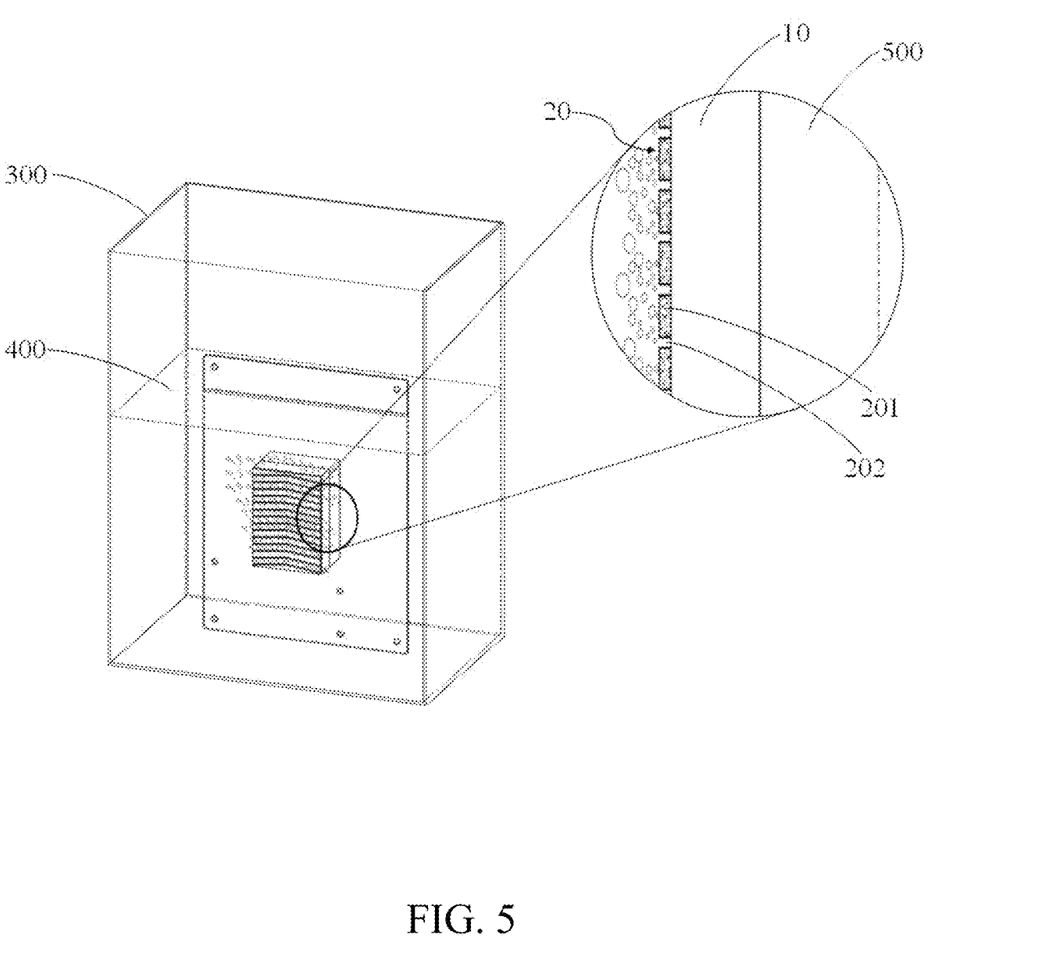
FIG. 5 is a schematic perspective view illustrating how an example two-phase immersion-cooling micro-grooved boiler is applied to cool a heat generating object, according to one or more embodiments.

Next, in order to describe in detail how the immersion-cooling boiler of the present invention operates in terms of practical application, with reference now to FIG. 5, there is presented a schematic perspective view illustrating how an example two-phase immersion-cooling micro-grooved boiler is applied to cool a heat generating object.

According to one embodiment, the present immersion-cooling boiler is in thermal contact with a heat generating object 500 to be cooled. Specifically, it's the heat transfer plate 10 of the immersion-cooling boiler that is in thermal contact with the heat generating object 500, which is submerged within a non-conductive insulating working fluid 400 in a cabinet 300. Preferably, the heat transfer plate 10 is mainly made of copper. When the heat generating object 500 operates, a great amount of heat is generated, and then transferred to the boiler by way of the heat transfer plate 10. Subsequently, the working fluid 400 is boiled due to absorbing the heat of the boiler. The boiling-triggered bubbles flow out from the surface of the capillary layer 20.

Furthermore, the capillary structure of the heat dissipating units 201 can be a mesh type or powder-sintered type. Taking the mesh type for example, the heat dissipating units 201 have a mesh structure made from a plurality of wires whose outer surface is attached with many small protrusions. The mesh has numerous capillary pores, which have a cross-sectional diameter of between 5 μm and 50 μm. The wires are made of such materials with toughness and good thermal conductivity as copper, aluminum, stainless steel, etc. It is worth noting that the capillary structure can be a wire mesh made from either such a single material or a combination of different materials. In addition, the protrusions attached onto the outer surface of the wires are fine powders whose particle size is about one-third to about one-fifth the diameter of the wires. The fine powders are made of materials such as copper, aluminum, stainless steel, etc.

In practical applications, when the heat generating object 500 operates, a great amount of heat is generated, and then transferred to the capillary layer 20 by way of the heat transfer plate 10. Absorbing the heat, the working fluid 400 within the heat dissipating units 201 starts being boiled to form bubbles. The boiling-triggered bubbles move within the capillary structure of the heat dissipating units 201, and then flow out from the surface of the capillary layer 20. Subsequently, the working fluid 400 continuously flows into the capillary layer 20 to achieve the effect of consistent heat transfer.

Besides, in order to prevent the entire outer surface of the capillary layer 20 from being covered by the boiling-triggered bubbles so that the working liquid 400 can flow into the capillary layer 20 for contact with the heat transfer plate 10, according to one embodiment, the capillary layer 20 has an array of micro-grooves 202, which divides the capillary layer 20 into a plurality of heat dissipating units 201. A bottom surface of the micro-grooves 202 is coated with a thermal resistance layer. The thermal resistance layer is adapted to reduce the heat transfer capacity of the heat transfer plate 10 such that the working liquid 400 on the bottom surface of the micro-grooves 202 can remain unboiled. Therefore, by way of the micro-grooves, the capillary pores of the immersion-cooling boiler can be replenished in time with sufficient working fluid to improve the heat transfer efficiency.

Notably, when the immersion-cooling boiler absorbs the heat generated by the heat generating object, the working liquid 400 can also flow from the sidewall of the micro-grooves 202 into the capillary pores of the heat dissipating units 201 without being blocked from contact with the heat transfer plate 10 by boiling-triggered bubbles. As a result, by way of the micro-grooves, dry-out of the immersion-cooling boiler can be avoided, thereby improving the heat exchange efficiency of the boiler and the flow-back rate of the working fluid.

Based on the foregoing disclosure of technical features, the present invention has the following advantages compared with the prior art:

1. Improving the cooling efficiency of the boiler: By way of the micro-grooves, dry-out of the immersion-cooling boiler can be avoided, thereby improving the heat exchange efficiency.
2. Meeting the need for high flow-back rate of the working fluid: The bottom surface of the micro-grooves is coated with a thermal resistance layer, which is adapted to reduce the heat transfer capacity of the heat transfer plate such that the working liquid can remain unboiled, and flow freely on the bottom surface of the micro-grooves.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

What is claimed is:

1. A two-phase immersion-cooling micro-grooved boiler submerged within a non-conductive insulated working fluid, comprising:
   a heat transfer plate-for thermal contact with a heat generating object to be cooled, the heat generating object being submerged within the working fluid; and
   a capillary layer positioned in tight contact with a surface of the heat transfer plate;
   wherein the capillary layer has an array of micro-grooves adapted to avoid dry-out of the boiler; the micro-grooves divide the capillary layer into a plurality of heat dissipating units; a bottom surface of the micro-grooves is coated with a thermal resistance layer such that the working fluid flows into the heat dissipating unit through a sidewall of the micro-grooves.

2. The two-phase immersion-cooling micro-grooved boiler of claim 1, wherein the microgrooves are arranged in a spaced, parallel relationship on the heat transfer plate.

3. The two-phase immersion-cooling micro-grooved boiler of claim 1, wherein the microgrooves are arranged on the heat transfer plate in a symmetrical, inclined direction toward a longitudinal center line of the heat transfer plate.

4. The two-phase immersion-cooling micro-grooved boiler of claim 1, wherein the microgrooves have a cross-sectional width of between 300 μm and 800 μm.

5. The two-phase immersion-cooling micro-grooved boiler of claim 1, wherein the heat dissipating units have a plurality of capillary pores which has a cross-sectional diameter of between 5 μm and 50 μm.

* * * * *